United States Patent [19]

Smit et al.

[11] Patent Number: 4,903,098
[45] Date of Patent: Feb. 20, 1990

[54] CHARGE-COUPLED DEVICE

[75] Inventors: Theodorus F. Smit; Jan w. Pathuis, both of Nijmegen, Netherlands

[73] Assignee: U.S. Philips Corp., New York, N.Y.

[21] Appl. No.: 273,123

[22] Filed: Nov. 17, 1988

Related U.S. Application Data

[63] Continuation of Ser. No. 7,296, Jan. 27, 1987, abandoned.

[30] Foreign Application Priority Data

Jan. 28, 1986 [NL] Netherlands .................... 8600185

[51] Int. Cl.⁴ .................... H01L 29/78; H01L 27/02; H01L 27/04
[52] U.S. Cl. .................... 357/24; 357/23.1; 357/41; 357/47; 357/48
[58] Field of Search ............ 357/24, 24 LR, 24 M, 357/41, 23.1, 47, 48

[56] References Cited

U.S. PATENT DOCUMENTS

| | | | |
|---|---|---|---|
| 4,048,519 | 9/1977 | Hoffmann et al. | 357/24 |
| 4,245,164 | 1/1981 | Funahashi | 357/23 LR |
| 4,503,450 | 3/1985 | Brewer | 357/24 M |
| 4,594,604 | 6/1986 | Kub | 357/24 M |
| 4,672,645 | 6/1987 | Bluzer et al. | 357/24 M |

FOREIGN PATENT DOCUMENTS 56-36162  4/1981  Japan .................... 357/24

Primary Examiner—Andrew J. James
Assistant Examiner—Ngan Van Ngo
Attorney, Agent, or Firm—Steven R. Biren

[57] ABSTRACT

The invention relates to a charge-coupled device with an adjustable charge transport route having at least two ccd segments, which can be connected in series with each other by means of a switchable connection. This connection includes an output diode for the first segment, an input diode for the first segment, an input diode for the second segment and a switch, for example a MOS transistor, which is connected to the output diode and/or the input diode. The input diode and the output diode may be in the form of individual zones or in the form of individual zones or in the form of a common zone. The invention, which offers the advantage that the transport time through the connection independent of the length of the form of the connection, can be used, for example, in programmable filters, (de)multiplexers, (de)scramblers and the like.

10 Claims, 3 Drawing Sheets

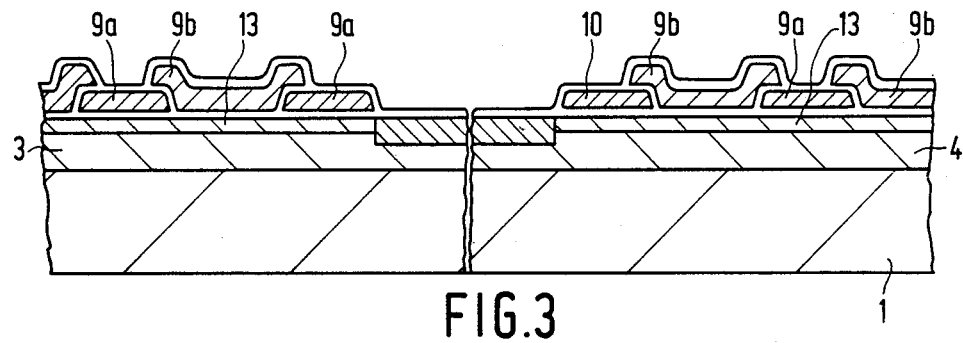
FIG.3
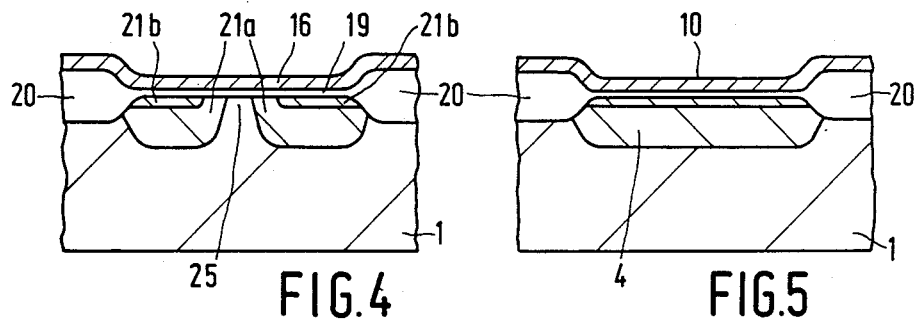
FIG.4    FIG.5
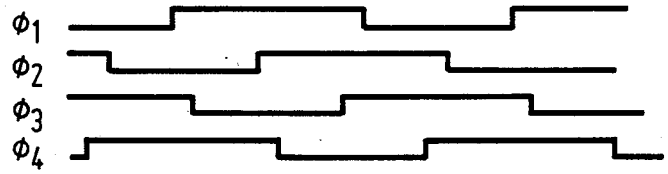
FIG.6
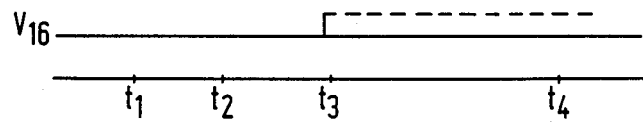
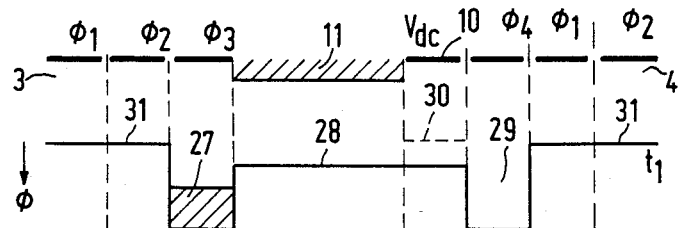
FIG.7a
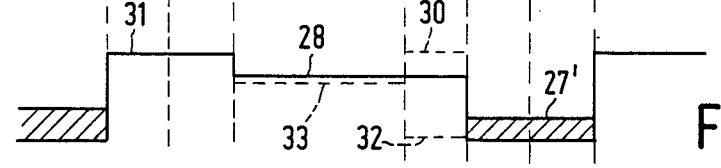
FIG.7b

CHARGE-COUPLED DEVICE

This is a continuation of application Ser. No. 007,296, filed Jan. 27, 1987, now abandoned.

BACKGROUND OF THE INVENTION

The invention relates to a charge-coupled device having a semiconductor body comprising a semiconductor layer of mainly the first conductivity type which adjoins a surface and in which a charge transport channel is defined for the storage and transport of information representing charge packets of the other type, this charge transport channel having at least two segments which can be connected in series with each other by means of a switchable connection, by means of which a charge packet that has been transported through the first segment of the charge transport channel may be transferred, as desired, to the second segment for further charge transport through the second segment.

Charge-coupled devices of the kind described here have an adjustable charge transport path and can be used for several applications. For example, several filters having different filter characteristics may be arranged beside each other on the semiconductor body, while the charge packets may be transported to the filter having the desired characteristic. Another application may be found in devices for multiplexing or demultiplexing signals. In other embodiments, it is possible to drain signals partly instead of transporting them to the second segment.

A charge-coupled device of the kind described above is known inter alia from Japanese Patent Application 51-103484 laid open to public inspection on 03-17-1978 under Kokai No. 53-29058. This Application describes a configuration in which the first segment, into which the charge is introduced, merges at a T crossing comprising a second a second and a third segment, whose charge transport directions are at right angles to the charge transport direction in the first segment. The switchable connections between the first segment on the one hand and the second and the third segment on the other hand are constituted by two insulated gates, by means of which the connection between the first segment on the one hand and the second or third segment on the other hand can be established and interrupted.

A disadvantage of such a coupling is that the freedom in designing the device is limited. For example, it is fairly difficult to provide in types of ccd's other than the meander type described in Kokai 53-29085 sharp bends in the charge transport channel without the electrical properties, such as the transport efficiency and the speed, being deteriorated. An even greater disadvantage is that, when the connection between the ccd segments to be coupled to each other extends over a larger distance, due to the use of one or more insulated gates as a switch, the transport time required to transport information form the first segment to the second segment becomes dependent upon the length of the connection.

SUMMARY OF THE INVENTION

The invention has for its object to provide a charge-coupled device of the kind described above, which has a high flexibility in design and/or which has such a connection that the transport time required to transfer the information from one segment to the other segment is independent of the length of the connection.

A charge-coupled device according to the invention is characterized in that the switchable connection comprises: a first zone of the other type constituting an output diode for the first segment; a second zone of the other type constituting an input diode for the second segment; and a switch, of which at least one of the main electrodes is connected to one of these zones.

Due to the fact that in a charge-coupled device according to the invention the connection is constituted by a zone or zones provided in the semiconductor body, a high degree of freedom in designing the device is obtained. Due to the fact that further this zone or one of these zones constitutes the input of the second segment, as appears from the following description of the Figures, the signal transmission from one segment to the other segment is practically independent of time, irrespective of the length of the connection.

BRIEF DESCRIPTION OF THE DRAWING

Further advantages of the invention will appear from the following description of the Figures, in which the invention will be described with reference to several embodiments with the associated diagrammatic drawing, in which:

FIG. 3 is a sectional view of the device shown in FIG. 2 taken on the line III—III;

FIG. 4 is a sectional view of the same device taken on the line IV—IV;

FIG. 5 is a sectional view of this device taken on the line V—V;

FIG. 6 shows a diagram of clock voltages to be applied to this device as a function of time;

FIG. 7 shows diagrams of the potential distribution obtained at a given number of instants in the device;

DESCRIPTION OF THE PREFERRED EMBODIMENTS

Figure 1:
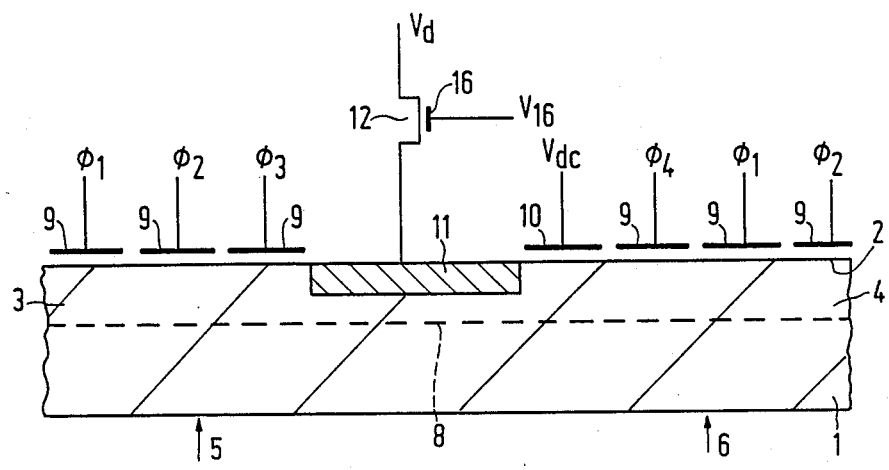
FIG. 1 is a diagrammatic sectional view of a charge-coupled device according to the invention.

FIG. 1 shows diagrammatically in sectional view a charge-coupled device according to the invention comprising two segments which can be connected functionally in series with each other by means of a switchable connection. The device is provided in a semiconductor body 1, at whose surface 2 defined the charge transport channels 3 and 4 of the charge-coupled segments 5 and 6, respectively. By way of example, it is assumed that the segments 5 and 6 are of the n-channel type, although the invention may also be used for p-type channel devices. The body 1 is of the p-type in the case of an n-channel ccd. The device may further be both of the surface channel type and of the buried channel type (indicated diagrammatically by the broken line 8). Above the charge transport channels, clock electrodes 9 are provided, to which clock voltages $\phi_i$ can be applied. In the present case of a 4-phase ccd, the clock voltages $\phi_1$, $\phi_2$, $\phi_3$ and $\phi_4$ are applied to the clock electrodes 9. Preferably, the same clock voltages are applied to the segments 5 and 6. Although this is not necessary, this embodiment is to be preferred because in this manner the number of clock generators remains limited. As appears from FIG. 1, the first clock electrode 9 in the segment 6 is preded by a gate 10 which is biased at the d.c. voltage $V_{dc}$. A switchable connection comprising the n+ zone 11 and the MOS transistor 12 acting as a switch is present between the segments 5 and 6. As will be explained more fully, the potential of the zone 11 can be varied by the switch 12 in such a manner that the connection between the segments 5 and 6 can be established and interrupted as desired.

Figure 2:
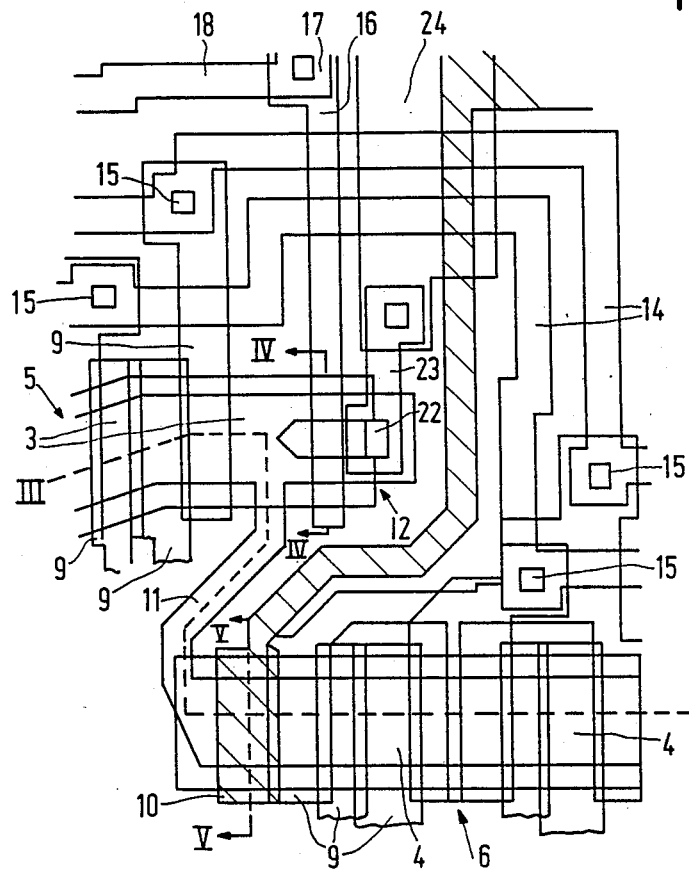
FIG. 2 is a plan view of a part of the specific embodiment of such a device.

FIGS. 2 and 5 show in plan view and in sectional view a practical embodiment of a charge-coupled device comprising the switchable connection shown in FIG. 1. As can be seen in FIG. 2, the channels 3 and 4 are arranged, not in line with each other, but partly beside each other in such a manner that the connection zone 11 is practically at right angles to the charge transport direction (from the lefthand to the righthand side) in the channels 3 and 4. The device is constituted by a ccd having an n-type buried channel and comprises a p-type silicon substrate 1 provided at its upper surface with an n-type implanted layer constituting the transport channels 3 and 4. The channels 3 and 4 as shown in FIG. 3 are preferably provided at the surface with a thin comparatively highly doped n-type layer 13, of which the doping concentration is considerably higher than that of the channels 3 and 4. For the effects the profiled doping profile has on the speed and the charge capacity of the charge-coupled device, reference may be made to U.S. Pat. No. 4,012,759. The clock electrodes 9 and the d.c. gate 10 are provided, as can be seen in FIG. 3, in a two-layer polycrystalline silicon technology (or a technology related thereto). The electrodes 9 provided in the first (lowermost) polycrystalline silicon layer are provided with the subscript a and the electrodes 9 in the second (uppermost) poly layer are provided with the subscript b. The d.c. gate 10 at the input of the second segment 6 is provided, like the last clock electrode 9 of the first segment 5, in the first poly layer. The order of succession of the poly layers may also be inverted, if desired. FIG. 2 further shows how poly electrodes 9 of the segment 5 are connected via conductor tracks 14 provided in a third wiring layer, for example of Al, to clock electrodes 9 of the segment 6 at the area of the contacts 15. The Al tracks are electrically insulated in the usual manner from the poly tracks by an oxide layer, in which openings or vias are formed at the area of the contacts 15.

The MOS transistors 12 is shown in sectional view at right angels to the current direction in FIG. 4. The transistor comprises a gate electrode 16 in polycrystalline silicon (poly 2) which is connected at the area of the contact 17 to an Al track 18. The gate electrode 16 is separated by a thin oxide layer 19, which also extends below the clock electrodes 9 above the charge transport channels 3 and 4, from the channel of the MOS transistor. The channel of the transistor 12 is limited by a thick field oxide pattern 20, which also forms the lateral boundary of the charge transport channels 3 and 4. The channel 21 of the field effect transistor 12, which is of the depletion type, has the same composition as and is obtained simultaneously with the charge transport channels 3 and 4. The source and the drain of the transistor 12 (which are not shown in FIG. 4) are constituted (cf. FIG. 2) by the part of the n-type transport channel 3 between the last clock electrode 9 and the gate electrode 16 and by the n-type region 22 connected to the Al track 23, respectively. The Al track 23 is in turn connected to a poly track 24, through which a d.c. voltage Vd can be applied to the drain 22 of the MOS transistor 12.

As appears from the sectional view of FIG. 4, the channel 21 does not extend throughout the width of the charge transport channel 3, but is reduced by the part 25 to two comparatively narrow subchannels, which are so narrow that due to so-called narrow channel effects the threshold voltage of the transistor 12 is increased. Thus, the decrease in threshold voltage occurring due to short channel effects caused by the choice of a gate 16 of minimum length can be compensated for. For comparison, FIG. 5 shows the sectional view of the charge transport segment 6 at the area of the d.c. gate electrode 10 (indicated in FIG. 2 by cross-hatched lines). The part of the charge transport channel 4 comprising the d.c. gate 10 the connection zone 11 located on the lefthand side of the d.c. gate 10 and the part of the charge transport channel 6 located below the next-following clock electrode 9 also constitutes a field effect transistor, whose relevant parameters correspond to those of the transistor 12.

FIG. 6 shows a diagram of the clock voltages $\phi_1$, $\phi_2$, $\phi_3$ and $\phi_4$ and also of the voltage $V_{16}$ applied to the gate 16 of the MOST switch 12 as a function of the time t. For the clocks $\phi_1$–$\phi_4$ use is made of socalled overlapping clocks, i.e. clock voltages overlapping each other to such an extent that at any instant during the transport a potential well is formed below two adjacent electrodes. Thus, the charge capacity is doubled as compared with the situation in which a charge packet is stored each time below only one electrode. The clocks $\phi_1$–$\phi_4$ vary, for example, between a low level of 0 V and a high (active) level of 10 V.

FIG. 7a shows diagrammatically the sectional view of FIG. 1; FIG. 7b therebelow shows the potential profile occurring in the charge transport channels 3 and 4 and in the connection zone 11 upon the application of the clocks according to FIG. 6. At the instant $t_1$, $V_{16}$ is low, just like $\phi_1$ and $\phi_2$, whereas $\phi_3$ and $\phi_4$ are high. Below the electrodes connected to $\phi_3$ and $\phi_4$ and further briefly designated as $\phi_3$ and $\phi_4$ electrodes, a potential well is induced. Below the $\phi_3$ electrode in the channel 3, a charge packet 27 is stored. The potential level 28 in the connection 11 is determined by the voltage $V_{dc}$ at the gate 10 and is such that the difference with $V_{dc}$ is just equal to the threshold voltage of the transistor, the source of which is constituted by the zone 11, the gate electrode of which is constituted by the gate 10 and the drain of which is constituted by the potential well 29 below the first $\phi_4$ electrode.

Below the $\phi_1$ and $\phi_2$ electrodes, which are at the low level, a potential barrier 31 is formed, which is slightly higher than the level 28. Below the gate electrode 16 of the MOST switch, a barrier 30 is induced, which is indicated in the drawing by broken lines. The voltage levels applied to the gate 16 of the switch 12 can be the same as those applied to the clock electrode 9.

If the width of the channel in the transistor 12 should be equal to the width of the charge transport channels 3, 4, upon application of the low voltage level to the gate 16, a potential level 30 would be induced below the gate 16, which would be slightly lower than the level the barrier 31 due to short channel effects. Due to narrow channel effects, the barrier 30 below the gate 16 will be slightly increased and will become practically equal to or slightly higher than the barrier 31, which permits of diving the gate 16 with the same voltage levels as the clock electrodes 9.

At the instant $t_2$, $\phi_1$ and $\phi_4$ are at the low level. Below the electrodes $\phi_2$ and $\phi_3$, a potential barrier is induced, while below the electrodes $\phi_2$ and $\phi_4$ a potential well is induced.

The charge packet 27 is transported in the n-type zone 11, as a result of which the potential in the zone 11 will decrease. Since the voltage $V_{dc}$ at the gate 10 does not vary, at the instant at which the packet 27 is introduced into the zone 11, charge (electrons) will simultaneously be introduced through the zone 11 into the potential well below the clock electrodes $\phi_4$, $\phi_1$ in the charge transport channel 4 and will form again a charge packet in this potential well. The injection of electrons into the charge transport channel 4 is continued until the voltage difference between the zone 11 and $V_{dc}$ at the gate 10 is equal to the threshold voltage. The charge packet 27' formed in the charge transport channel 4 below the clock electrodes $\phi_4$ and $\phi_1$ is then substantially of the same size as the charge packet 27.

It should be noted that the transfer of the signal from the charge transport channel 3 to the signal from the charge transport channel 4 takes place through the connection zone 11. Thus, the designer is given a high degree of freedom in designing the device, which permits, as appears from FIG. 2, for example, of providing sharp bends in the charge transport route. It should further be noted that it is possible to connect the first clock electrode 9 after the d.c. gate 10 in the charge transport channel instead of to $\phi_4$ to $\phi_1$ and to connect the next following clock electrodes successively to $\phi_2$, $\phi_3$, $\phi_4$, $\phi_1$ etc. Due to the fact that $\phi_1$ remains at the high level for a longer time than the preceding clock electrode $\phi_4$, such a through connection would afford the advantage that the period available for transferring charge through the connection zone 11 would become slightly longer. However, the embodiment described here, in which the first clock electrode in the channel 4 is connected to $\phi_4$, that is to say the clock electrode immediately following the last clock electrode in the charge transport channel 3, has the advantage that, when the signal is transferred, the packet 27' is stored in a large potential well below $\phi_4$, $\phi_1$. Due to the large capacitance, the feedback from the charge packet 27' to the threshold voltage below the d.c. gate 10 is comparatively small, as a result of which the trasport efficiency is practically independent of the signal value.

During the transport mechanism described here, the switch 12 is non-conducting (open) due to the low voltage at the gate 16. At the instant $t_3$ (FIG. 6) (indicated by the broken line), $V_{16}$ passes to the high (active) level, which is again equal to the active level of the clocks $\phi_1$, $\phi_2$, $\phi_3$, $\phi_4$.

The potential barrier 30 is replaced by the low voltage level 32 (lowermost potential diagram in FIG. 7b). The potential in the zone 11 passes to the level 33, which is determined by the low voltage $V_d$ at the drain of the transistor 12. When a charge packet 27 is introduced into the connection zone 11 ($t_4$), this charge packet is not transported to the charge transport channel 4, but is drained through the transistor 12. The channel below the d.c. gate 10 in this situation is non-conducting due to the fact that the potential level 33 lies below the threshold voltage of the d.c. gate 10, as a result of which no charge is introduced into the charge transport channel 4. When the connection between the transport channels 3 and 4 has to be established again, the voltage at the gate electrode is reduced again, as a result of which the potential below the electrode 16 again passes to the level 30. Before information representing signals are transported again to the channel 4, if desired, first a reference charge may be transported through the channels 3, 4 in order to reduce the potential of the connection zone 11 to the level 28. The next following information representing charge packet can be transferred without any loss of charge through the zone 11 to the transport channel 4. In the embodiment described here, a charge packet may be transported further by means of the switchable connection (11, 12) by the charge-coupled device or be drained via the switch 12.

Figure 8:
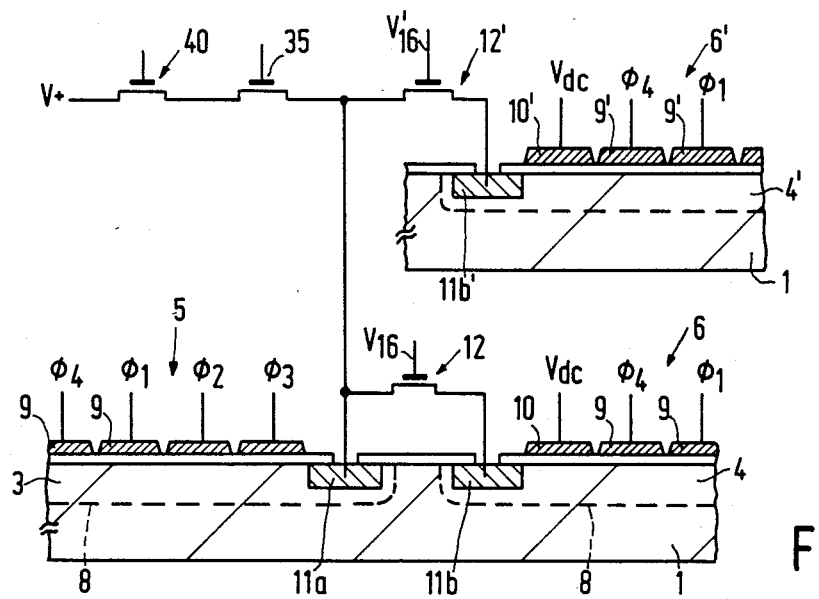
FIG. 8 shows diagrammatically in sectional view a second embodiment of a charge-coupled device according to the invention.

FIG. 8 shows diagrammatically an embodiment of a switchable connection by means of which a charge packet can be transported to one or to the other charge transport channel. The drawing shows a semiconductor body which again comprises a charge transport channel 3 and a charge transport channel 4 associated with the ccd segments 5 and 6, respectively. The body 1 is again assumed to be of the p-type, while the ccd segments 5 and 6 are assumed to be of the n-channel type. In the case of surface channels, the body 1 is wholly of the p-type; in the case in which the ccd segments 5 and 6 are of the buried type, the charge transport channels 3 and 4 are of the n-type (indicated diagrammatically by the broken line). In addition to the segment (6, 4), this embodiment comprises a third ccd segment 6', which in the drawing is located above the segment (6, 4) and should be considered to be integrated in the same semiconductor body 1 as the segments 5, 6. Apart from the body 1, this segment is provided for corresponding parts with the same accented reference numerals as the segment 6. The segments 6, 6' may be, for example, two filters having different filter characteristics.

The connection zone 11, which in the preceding embodiment constitutes both the output diode for the segment 5 and the input diode for the segment 6, is subdivided in the present embodiment into mutually separated subzones 11a, 11b, 11'b. The switch 12 forms a connection between the n-type zones 11a and 11b, while by means of the MOST switch 12' the connection between the n-type zones 11a and 11'b can be established or interrupted. The MOST switches 12, 12' are controlled by the gate voltages $V_{16}$ and $V'_{16}$. In the case in which the charge packets are supplied through the channel 3 or have to be passed to the channel 4 or to the channel 4', the gate voltages $V_{16}$ and $V'_{16}$ can be simply formed by two signals in phase opposition. However, it is alternatively possible that other routes are present, shown diagrammatically in FIG. 8 by the transistor 35, for example a further ccd segment or a drain. In this case, the transistors 12 and 12' can be simultaneously non-conducting.

The transistors 12, 12', 35 may be analogous to the transistor 12 in the prededing embodiment, while narrow channel effects may advantageously be utilized, as a result of which the same voltage levels can be used for the control voltages $V_{16}$, $V'_{16}$ as the clock voltages $\phi_1$–$\phi_4$.

Figure 10:
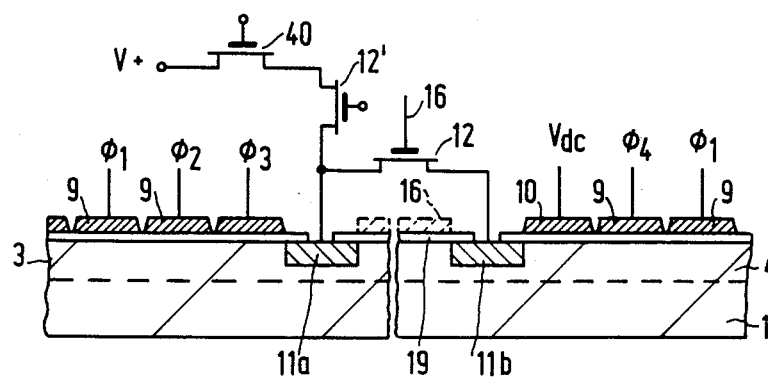

In the first embodiment described with reference to FIGS. 1 to 7, the output zone of the first segment 5 and the imput zone of the second segment 6 are formed by the coherent zone 11, which constitutes both the output diode of the segment 5 and the input diode of the segment 6. In this embodiment, the charge transport between the channels 3 and 4 is blocked by reducing the potential at this common zone to such an extent that the voltage between $V_{dc}$ at the gate 10 and this zone falls below the threshold voltage. As indicated in the description of this embodiment, when the connection between the channels 3 and 4 is established again, the first charge packet transported to the channel 4 is used to increase the potential of the zone 11 again to the threshold voltage level so that it cannot be used for the signal processing. FIG. 10 is a sectional view of a variation of the first embodiment, in which the potential of the zone 11 can be readjusted in a different manner. For this purpose, the zone 11 is subdivided into two spaced subzones 11a and 11b, which constitute the output diode of the channel 3 and the input diode of the channel 4, respectively. The zones 11a and 11b constitute (or are connected to) the source and drain zones of the switching MOST 12. This transistor can be simply formed by providing on the oxide 19 between the subzones 11a, 11b the gate 16 indicated by broken lines. The output diode 11a is further connected to one of the main electrode regions of the field effect transistor 12', of which the other main electrode region is connected through the field effect transistor 40 to a reference voltage Vt. The parameters of the transistor 40 are assumed to be identical to the parameters of the transistor, whose source is constituted by the electrode 10 and whose drain is constituted by the channel 4 below $\phi_4$. The voltage Vt can be chosen so that the potential of the zone 11a is maintained at the threshold voltage 28 of this transistor. During operation, in the case in which charge should be transferred from the channel 3 to the channel 4, the transistor 12 is closed, while the transistor 12' is open. In the case in which charge packets have to be drained, the transistor 12 is opened and the transistor 12' is closed. With a suitable choice of the voltage to be applied to the gate of the transistor 40, i.e. the same voltage $V_{dc}$ as that applied to the gate 10 and with the same threshold voltage below the gate of the transistor 40 as below the gate 10, the potential of the zone 11a substantially does not vary. As a result, the next following signal which is supplied through the channel 3 after the switch 12 has been closed again and the switch 12' has been opened, can be transferred without disturbance via the connection 11a, 12, 11b to the channel 4 and can be transported further via the channel 4 for further signal processing.

In an analogous manner, in the embodiment shown in FIG. 8, the potential of the zone 11a can be adjusted to the desired values by means of a similar transistor 40.

Figure 9:
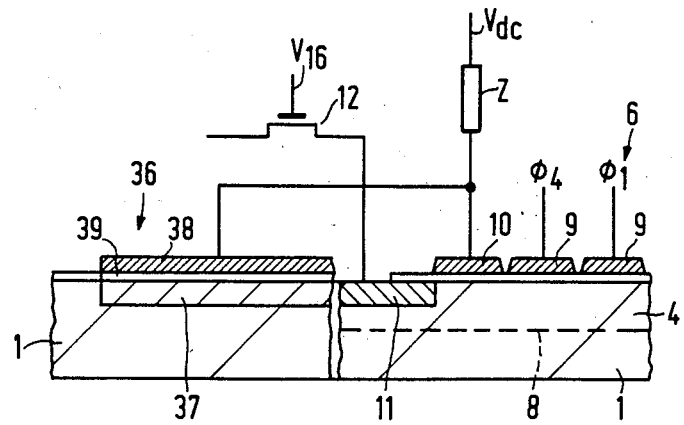
FIG. 9 is a sectional view of a part of a third embodiment of a charge-coupled device according to the invention and FIG. 10 shows a fourth embodiment of a charge-coupled device according to the invention.

In the embodiments described here, it may occur that fluctuations of the substrate potential, for example due to clock cross-talk, influence the signal transmission via the switchable connection 11, 12. FIG. 9 shows diagrammatically a method of reducing this cross-talk. In the drawing, the input part of the ccd segment 6 (or of the segment 6') is shown again. The d.c. electrode 10 is now not connected, however, directly to the voltage $V_{dc}$, but is connected thereto through an impedance Z. The gate 10 is coupled on the other hand to the substrate 1 via a capacitor, which in the present embodiment is constituted by a MOS capacitor 36, which is provided in the semiconductor body 1. The capacitor comprises a p-type surface zone 27, which is provided at the surface 2 and constitutes one plate of the capacitor 36, which is connected to the substrate 1 and an electrode 38 of metal or of polycrystalline silicon or another suitable conductive material, which constitutes the other plate of the capacitor, which is connected to the d.c. gate 10. The plates 37 and 38 are mutually separated by a thin insulating layer 39, for example, an oxide layer, which is formed simultaneously with the oxide layer below the clock electrodes 9 and the d.c. gate 10. Potential fluctuations in the substrate 1 are passed on via the capacitance 36 to the d.c. gate 10, as a result of which the voltage between the d.c. gate 10 and the semiconductor body 1 is substantially insensitive to the interference.

It will be appreciated that the invention is not limited to the embodiments described herein, but that many further variations are possible for those skilled in the art without departing from the scope of the invention.

What is claimed is:

1. A charge-coupled device having a semiconductor body comprising a surface-adjoining semiconductor layer substantially of a first conductivity type, said semiconductor layer having a charge transport channel for storage and transport of information representing charge packets, said charge packets corresponding to a second conductivity type opposite to that of the first conductivity type, a switchable connection, said charge transport channel having at least two segments which can be connected in series with each other by said switchable connection, by means of which a charge packet that has been transported through the first segment of the charge transport channel may be transferred to the second segment for further charge transport through the second segment, the switchable connection comprising a first zone of said second conductivity type and constituting an output diode for the first segment, a second zone of the second conductivity type constituting an input diode for the second segment, and a switch having at least one main electrode connected to one of these zones.

2. A charge-coupled device as claimed in claim 1, characterized in that the first zone and the second zone comprise two mutually-separated regions and in that a main electrode of the switch is connected to the first zone and a second main electrode of the switch is connected to the second zone.

3. A charge-coupled device as claimed in claim 1, characterized in that the first zone and the second zone comprise a coherent region which is connected to one of the main electrodes of the switch.

4. A charge-coupled device as claimed in claim 1, 2 or 3, characterized in that the switch comprises insulated gate field effect transistor, of which at least one of the source and drain regions is connected to one of the first and the second zones.

5. A charge-coupled device as claimed in claim 1, 2 or 3, characterized in that the second segment comprises a system of electrodes for applying voltages for the storage and the transport of charge packets, and, viewed in the charge transport direction, the first electrode of said system of electrodes is provided with a connection for applying a reference voltage.

6. A charge-coupled device as claimed in claim 5, characterized in that a second and a third electrode are provided with connections for applying such clock voltages that, when a charge packet is introduced through the second zone in to the second segment, a potential well is induced in the second segment of the charge transport channel, which potential well extends below the second and third electrodes.

7. A charge-coupled device as claimed in claim 6, characterized in that the first segment and the second segment of the charge transport channel are provided with a system of clock electrodes which are provided with connections such that the same clock voltages can be applied to the clock electrodes associated with first segment as to the clock electrodes associated with the second segment and in that the clock voltage cyclically following a clock voltage applied to the last clock electrode of the system of clock electrodes of the first segment is applied to a second electrode of the system of clock electrodes of the second segment.

8. A charge-coupled device as claimed in claim 7, characterized in that the device constitutes a 4-phase device, for which purpose the clock electrodes are divided into groups of four electrodes, a clock voltage $\phi_1$ being applied to a first electrode of each group, a clock voltage $\phi_2$ being applied to a second electrode of each group, a clock voltage $\phi_3$ being applied to a third electrode of each group and a clock voltage $\phi_4$ being applied to a fourth electrode of each group.

9. A charge-coupled device as claimed in claim 6, characterized in that a first electrode of a second segment can be connected via a comparatively high impedance Z to the reference voltage and is capacitively connected through a comparatively low impedance to the semiconductor layer of the first conductivity type.

10. A charge-coupled device as claimed in claim 9, further comprising means for applying such a voltage that a charge packet is transported from the region below a last clock electrode of the first segment further via the field effect transistor having a gate electrode, said gate electrode of the field effect transistor being connected to said means for applying the voltage.

* * * * *